(12) United States Patent
Nagamine et al.

(10) Patent No.: US 9,705,076 B2
(45) Date of Patent: Jul. 11, 2017

(54) MAGNETORESISTIVE ELEMENT AND MANUFACTURING METHOD OF THE SAME

(71) Applicants: Makoto Nagamine, Seoul (KR); Youngmin Eeh, Seoul (KR); Koji Ueda, Seoul (KR); Daisuke Watanabe, Seoul (KR); Kazuya Sawada, Seoul (KR); Toshihiko Nagase, Seoul (KR); Masahiko Nakayama, Seoul (KR)

(72) Inventors: Makoto Nagamine, Seoul (KR); Youngmin Eeh, Seoul (KR); Koji Ueda, Seoul (KR); Daisuke Watanabe, Seoul (KR); Kazuya Sawada, Seoul (KR); Toshihiko Nagase, Seoul (KR); Masahiko Nakayama, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 131 days.

(21) Appl. No.: 14/478,971

(22) Filed: Sep. 5, 2014

(65) Prior Publication Data

US 2015/0263271 A1    Sep. 17, 2015

Related U.S. Application Data

(60) Provisional application No. 61/952,762, filed on Mar. 13, 2014.

(51) Int. Cl.
*H01L 43/10* (2006.01)
*H01L 43/08* (2006.01)
*H01L 27/22* (2006.01)
*H01L 43/12* (2006.01)

(52) U.S. Cl.
CPC ............ *H01L 43/10* (2013.01); *H01L 27/228* (2013.01); *H01L 43/08* (2013.01); *H01L 43/12* (2013.01)

(58) Field of Classification Search
USPC ...................................... 257/295, 421; 438/3
IPC .................... H01L 43/10,43/08, 27/228, 43/12, H01L 43/02
See application file for complete search history.

(56) References Cited

U.S. PATENT DOCUMENTS

| 8,009,391 B2 | 8/2011 | Tanaka et al. |
| 8,218,355 B2 | 7/2012 | Kitagawa et al. |
| 2014/0131824 A1 | 5/2014 | Kitagawa et al. |
| 2014/0284733 A1* | 9/2014 | Watanabe ............... H01L 43/10 257/421 |

FOREIGN PATENT DOCUMENTS

JP          2011249590 A     12/2011

* cited by examiner

*Primary Examiner* — Hrayr A Sayadian
(74) *Attorney, Agent, or Firm* — Holtz, Holtz & Volek PC

(57) ABSTRACT

According to one embodiment, there is provided a magnetoresistive element, including a lower electrode having crystallinity on a substrate, a first conductive layer including an amorphous state on the lower electrode, a buffer layer on the first conductive layer, and an MTJ element on the buffer layer.

17 Claims, 5 Drawing Sheets

MAGNETORESISTIVE ELEMENT AND MANUFACTURING METHOD OF THE SAME

CROSS-REFERENCE TO RELATED APPLICATIONS

This application claims the benefit of U.S. Provisional Application No. 61/952,762, filed Mar. 13, 2014, the entire contents of which are incorporated herein by reference.

FIELD

Embodiments described herein relate generally to a magnetoresistive element and a manufacturing method of the same, and a nonvolatile semiconductor memory.

BACKGROUND

Recently, a large-capacity magnetoresistive random access memory (MRAM) using a magnetic tunnel junction (MTJ) element has been expected and attracted attention. In the MTJ element used for the MRAM, one of the two ferromagnetic layers that sandwich a tunnel barrier layer is set as a magnetization fixed layer (reference layer) where the direction of magnetization is fixed, and the other layer is set as a magnetization free layer (storage layer) where the direction of magnetization is made to be easily inverted. In this structure, information can be stored by associating, with binary numbers "0" and "1," a state in which the direction of magnetization is parallel between the reference layer and the storage layer, and a state in which the direction of magnetization is opposite between them.

DETAILED DESCRIPTION

In general, according to one embodiment, there is provided a magnetoresistive element, comprising: a lower electrode having crystallinity on a substrate; a first conductive layer including an amorphous state on the lower electrode; a buffer layer on the first conductive layer; and an MTJ element on the buffer layer.

Embodiments will be described hereinafter with reference to the accompanying drawings.

First Embodiment

The MTJ element used in MRAM is formed on a substrate on which a switching transistor is formed, via a buffer layer. For this reason, a magnetic characteristic of the MTJ element is deteriorated if crystallinity of the buffer layer is worsened. The crystallinity of the buffer layer therefore needs to be improved.

Figure 1:
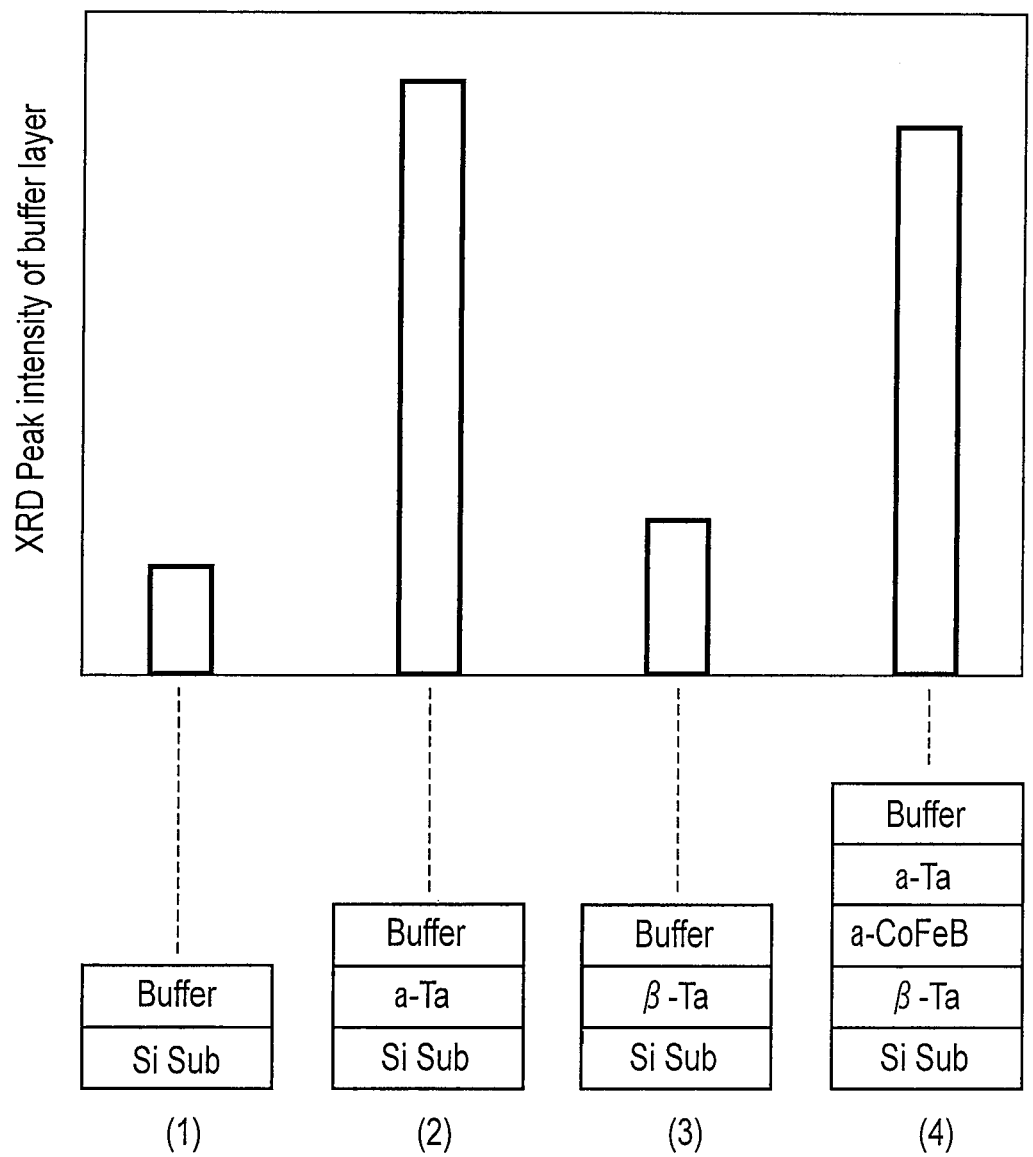
FIG. 1 is a graph showing a relationship between a base constitution of a buffer layer and an X-ray diffraction (XRD) peak intensity.

FIG. 1 is a graph showing a relationship between a base constitution in a buffer layer used for the formation of the MTJ element and an XRD peak intensity of the buffer layer. The XRD peak intensity corresponds to crystallinity of Hf. In other words, the XRD peak intensity becomes increased if the crystallinity of Hf is good, and the XRD peak intensity becomes reduced if the crystallinity of Hf is bad.

In a structure (1) in which a buffer layer (Hf) is formed on a substrate of Si, etc., the peak intensity of the buffer layer is extremely lowered. In contrast, in a structure (2) in which the buffer layer (Hf) is formed on a substrate via a first amorphous conductive layer (a-Ta), the peak intensity becomes significantly increased.

In addition, in a structure (3) in which the buffer layer (Hf) is formed on a substrate via a crystalline lower electrode (β-Ta), the peak intensity of the buffer layer is significantly lowered. In contrast, in a structure (4) in which the buffer layer (Hf) is formed on a substrate via the crystalline lower electrode (β-Ta), a first amorphous conductive layer (a-CoFeB), and the first amorphous conductive layer (a-Ta), the peak intensity of the buffer layer is significantly increased.

In other words, if the buffer layer of Hf is formed on the conductive layer a-Ta, the crystallinity of the buffer layer is increased. If the crystallinity of the buffer layer is increased, diffusion from the buffer layer to an upper layer side of the buffer layer is suppressed, which can contribute to improvement of the magnetic characteristic in the MTJ element.

The above phenomenon occurs in use of not only Hf as the buffer layer, but also the other metal material. The material of the lower electrode and the first conductive layer is not limited to Ta, but the other amorphous metal material can also be used as the material of the lower electrode and the first conductive layer. Furthermore, the material of the second conductive layer is not limited to CoFeB, but an amorphous metal material different from the material of the lower electrode can be used.

The present embodiment aims to improve the magnetic characteristic of the MTJ element by employing the structure (4).

Figure 2:
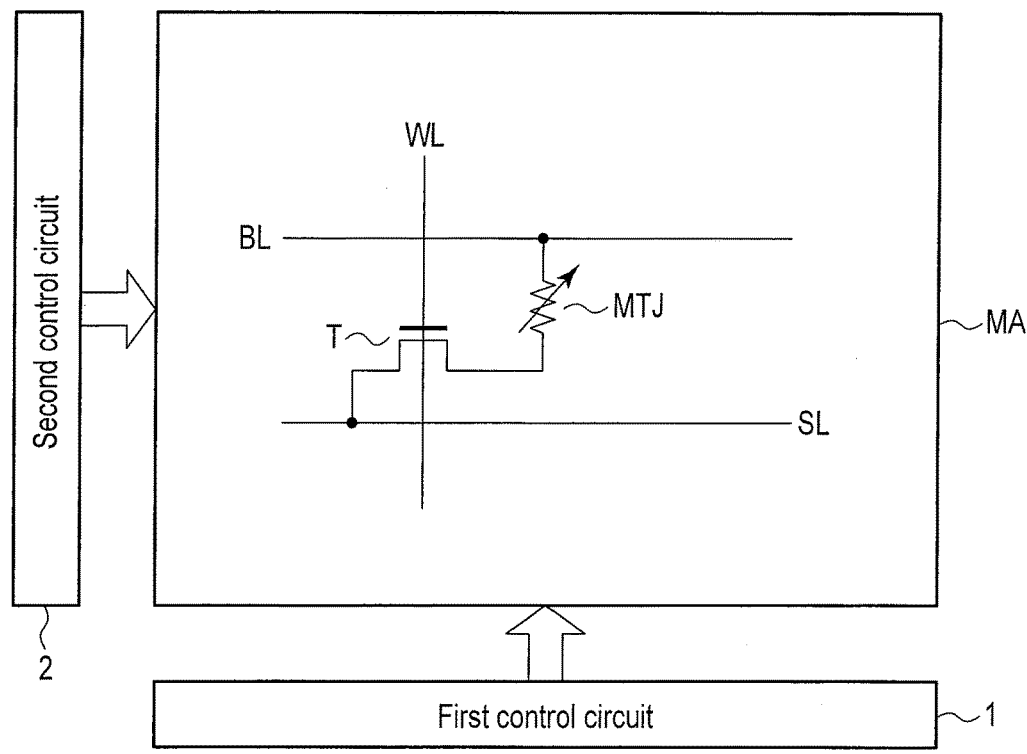
FIG. 2 is a circuit configuration diagram showing a memory cell array of MRAM using a magnetoresistive element of a first embodiment.

FIG. 2 is a circuit diagram showing a memory cell array of MRAM using the magnetoresistive element of the present embodiment.

A memory cell in the memory cell array MA comprises a serial connection body of the MTJ element serving as the magnetoresistive element and a switching element (for example, a field effect transistor (FET)) T. One of ends of the serial connection body (i.e. one of ends of the MTJ element) is electrically connected to a bit line BL and the other end of the serial connection body (i.e. one of ends of the switching element T) is electrically connected to a source line SL.

A control terminal of the switching element T, for example, a gate electrode of the FET is electrically connected to a word line WL. An electric potential of the word line WL is controlled by a first control circuit 1. Electric potentials of the bit line BL and the source line SL are controlled by a second control circuit 2.

Figure 3:
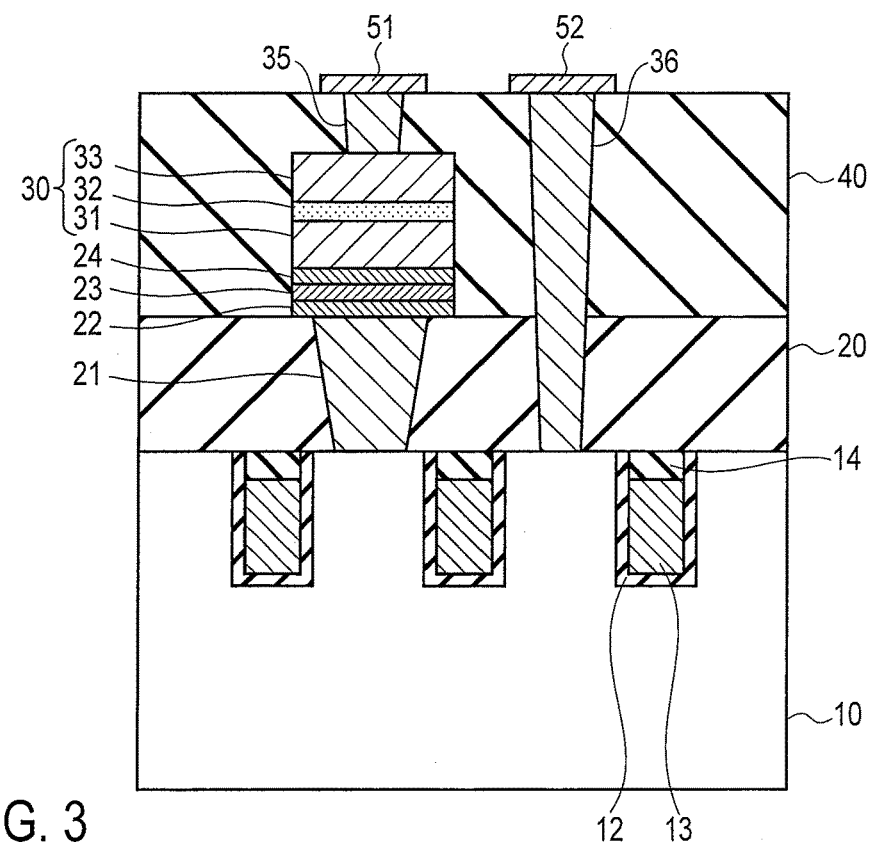
FIG. 3 is a cross-sectional view showing a structure of a memory cell module using the magnetoresistive element of the first embodiment.

FIG. 3 is a cross-sectional view showing a structure of a memory cell module using the magnetoresistive element of the present embodiment.

A switching MOS transistor is formed on a surface of a Si substrate 10 and an interlayer insulating film 20 is formed on the transistor. The transistor has an embedded gate structure in which a gate electrode 13 is embedded in a groove formed in the substrate 10 via a gate insulation film 12. The gate electrode 13 is embedded in the groove halfway through, and a protective insulation film 14 is formed on the gate electrode 13. In addition, source and drain regions (not shown) are formed on both sides of the embedded gate structure, by diffusing p-type or n-type impurity in the substrate 10.

The constitution of the transistor module is not limited to a transistor module comprising the embedded gate structure. For example, the gate electrode may be formed on the surface of the Si substrate 10 via the gate insulation film. The transistor module may be constituted to function as a switching element.

In the interlayer insulating film 20, a contact hole through which connection with the drain of the transistor is made is formed, and a lower electrode (BEC) 21 is embedded in the contact hole. The lower electrode 21 is formed of a metal having crystallinity (tetragon in metastable phase) which is, for example, β-Ta.

On the lower electrode 21, a conductive layer (second conductive layer) 22 formed of amorphous CoFeB, a conductive layer (first conductive layer) 23 formed of amorphous Ta, and a buffer layer 24 formed of Hf, are stacked. In other words, the structure shown in FIG. 1(4) is formed.

If the a-Ta conductive layer 23 is directly formed on the β-Ta lower electrode 21, the a-Ta conductive layer 23 does not become sufficiently amorphous and is often partially crystallized due to an influence of the base. Since the a-CoFeB conductive layer 22 is formed of the material different from the material of the β-Ta lower electrode 21, the a-CoFeB conductive layer 22 is not influenced by the crystallinity of the base. By forming the a-Ta conductive layer 23 on the a-CoFeB conductive layer 22, the conductive layer 23 can become amorphous without being influenced by the crystallinity of the base.

Thus, the amorphous state of the conductive layer 23 can be maintained by inserting the a-CoFeB conductive layer 22 between the β-Ta lower electrode 21 and the a-Ta conductive layer 23. Improvement of the crystallinity of the Hf buffer layer 24 can be thereby attempted.

A CoFeB film 31 serving as a ferromagnetic magnetization free layer, an MgO film 32 serving as a tunnel barrier layer, and a CoFeB film 33 serving as a ferromagnetic magnetization fixed layer are stacked on the buffer layer 24. In other words, the MTJ element 30 formed by sandwiching the tunnel barrier layer between the two ferromagnetic layers is constituted.

An interlayer insulation film 40 is formed on the substrate on which the MTJ element 30 is formed. A contact plug (TEC) 35 connected with a reference layer (CoFeB film) 33 of the MTJ element 30 is embedded in the interlayer insulation film 40. In addition, a contact plug 36 connected to the source of the transistor module is embedded through the interlayer insulation film 40 and the interlayer insulation film 20. A wiring line (BL) 51 connected to the contact plug 35 and a wiring line (SL) 52 connected to a contact plug 36 are formed on the interlayer insulation film 40.

Next, a method of manufacturing the memory cell module of the present embodiment will be described with reference to FIGS. 4A to 4C.

Figure 4A:
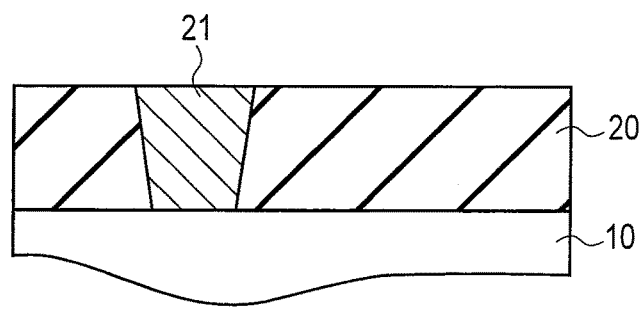
FIGS. 4A to 4C are cross-sectional views showing manufacturing steps of the memory cell module shown in FIG. 3.

First, a switching MOS transistor (not shown) having the embedded gate structure is formed on a surface portion of the Si substrate 10, and the interlayer insulation film 20 of SiO$_2$ etc. is deposited on the Si substrate 10 by CVD, as shown in FIG. 4A. Then, a contact hole to make connection with the drain of the transistor is formed in the interlayer insulation film 20, and the lower electrode 21 formed of crystalline Ta (β-Ta) is embedded in the contact hole. More specifically, the β-Ta film is deposited on interlayer insulation film 20 by the spattering, etc. to embed the contact hole, and the β-Ta film is left in the contact hole alone by removing the β-Ta film on the interlayer insulation film by the chemical mechanical etching (CMP).

Figure 4B:
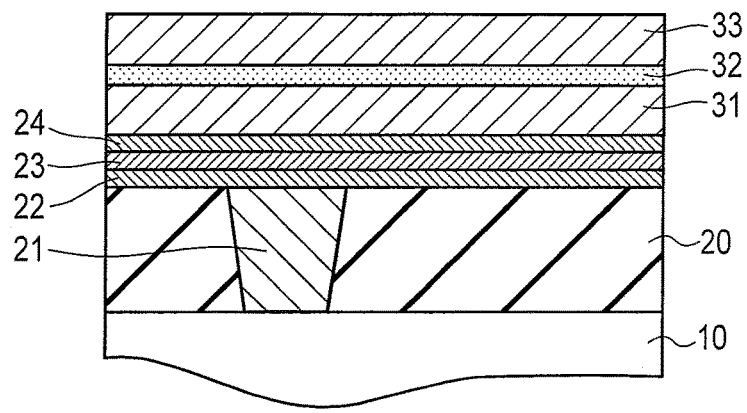

Next, the conductive layer 22 formed of amorphous CoFeB, the conductive layer 23 formed of amorphous Ta, and the buffer layer 24 formed of Hf, which are technical features of the present embodiment, are formed on the interlayer insulation film 20 and the lower electrode 21 by the spattering, etc. as shown in FIG. 4B. In other words, the a-CoFeB conductive layer 22, the a-Ta conductive layer 23 and the Hf buffer layer 24 are formed on the β-Ta lower electrode 21, similarly to the structure shown in FIG. 1(4).

Since the a-Ta conductive layer 23 is not formed directly on the β-Ta lower electrode 21, but formed via the a-CoFeB conductive layer 22, the a-Ta conductive layer 23 can maintain the amorphous state without being influenced by the crystallinity of the β-Ta lower electrode 21. In addition, since the Hf buffer layer 24 is formed on the a-Ta conductive layer 23, improvement of the crystallinity of the Hf buffer layer 24 can be attempted.

Next, the CoFeB film 31 which is to serve as a memory layer of the MTJ element, the MgO film 32 which is to serve as a tunnel barrier layer, and the CoFeB film 33 which is to serve as a reference layer are formed on the buffer layer 24 by spattering, etc. In other words, the layered structure for formation of the MTJ element in which the nonmagnetic tunnel barrier layer is sandwiched between the ferromagnetic layers is formed.

Figure 4C:
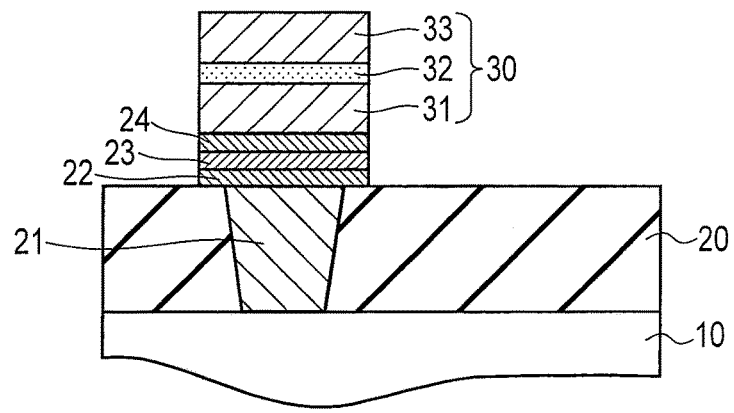

Next, the MTJ element 30 is formed by processing the layered portions 22, 23, 24, 31, 32 and 33 in a cell pattern as shown in FIG. 4C. More specifically, a cell pattern mask is formed on the CoFeB film 33, and the layered portions are subjected to selective etching by RIE, etc. so as to be left in an insular shape on the lower electrode 21.

In the etching, too, if an etching product is deposited on a side wall surface of the MTJ element 30, short may occur on the side wall surface. However, the side wall surface can be easily oxidized by using a material having a lower standard electrode potential than that of each member of the MTJ element 30, for the lower electrode 21, the conductive layers 22 and 23, etc. The short failure can be thereby suppressed.

After that, the interlayer insulation film 40 is formed, then the contact plugs 35 and 36 are formed, and the wiring lines 51 and 52 are further formed. The constitution shown in FIG. 3 can be thereby obtained.

Thus, according to the present embodiment, the crystallinity of the Hf buffer layer 24 can be increased as shown in FIG. 1, by inserting the conductive layer 22 formed of a-CoFeB and the conductive layer 23 formed of a-Ta between the Hf buffer layer 24 which serves as a base of the MTJ element 30 and the β-Ta lower electrode 21. For this reason, the improvement of the magnetic characteristic of the MTJ element 30 can be attempted, and the high MR ratio can be implemented.

In addition, since the a-CoFeB conductive layer 22 is inserted between the a-Ta conductive layer 23 and the β-Ta lower electrode 21, crystallization of the conductive layer 23 caused by an influence of the lower electrode 21 can be prevented and the a-Ta conductive layer 23 can become sufficiently amorphous when the lower electrode 21 and the conductive layer 23 are formed of the same material.

The material of the second conductive layer 22 is not limited to CoFeB and may be different from the material of the lower electrode 21 and the conductive layer 23. For example, a boride or a nitride of a metal, such as HfB, MoN, and NbN, can be used.

Second Embodiment

Figure 5:
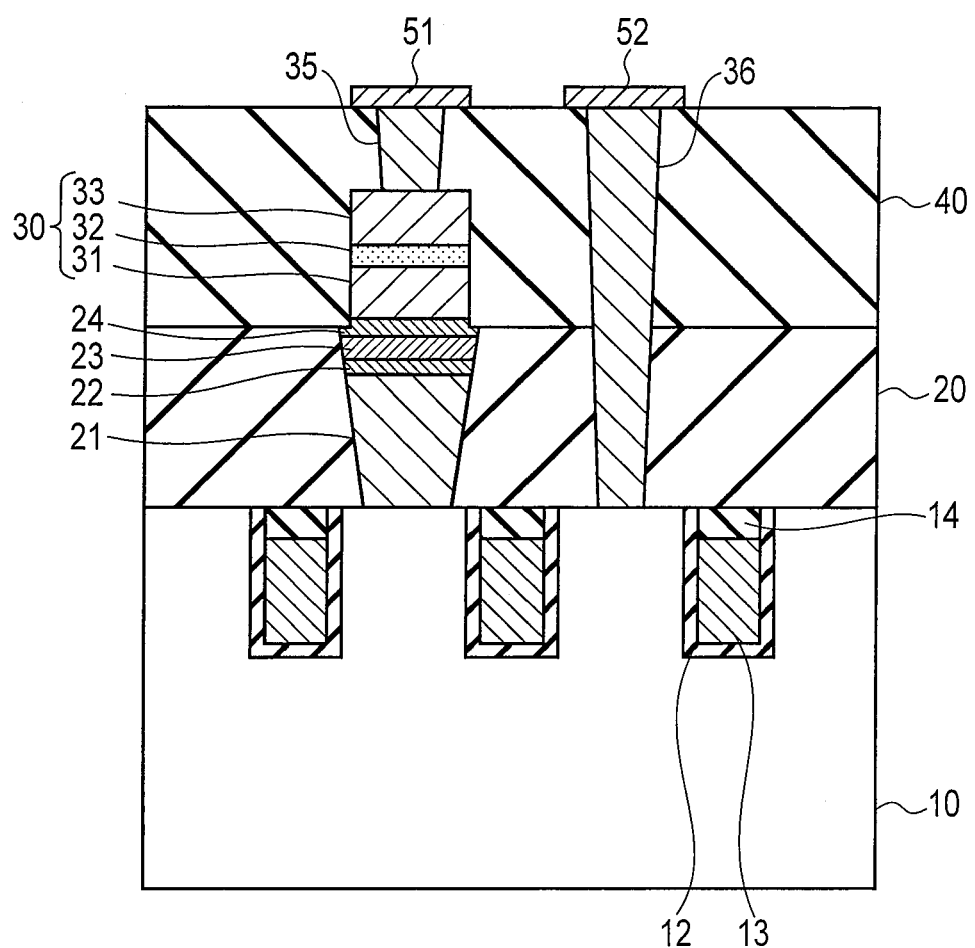
FIG. 5 is a cross-sectional view showing a structure of a memory cell module using a magnetoresistive element of a second embodiment.

FIG. 5 is a cross-sectional view showing a structure of a memory cell module using a magnetoresistive element of a second embodiment. Portions like those in FIG. 3 are denoted by the same reference numbers, and their detailed descriptions are omitted.

A difference between the present embodiment and the above-described first embodiment is an etching method for processing an MTJ element in a cell pattern.

In the present embodiment, not only a lower electrode (BEC) 21, but also an a-CoFeB conductive layer 22, an a-Ta conductive layer 23, and a Hf buffer layer 24 disposed above the lower electrode (BEC) 21, are embedded in a contact hole. Then, an MTJ element 30 comprising a CoFeB film 31, a MgO film 32, and a CoFeB film 33 is formed on the buffer layer 24.

Next, a method of manufacturing the memory cell module of the present embodiment will be described with reference to FIGS. 6A to 6C.

Figure 6A:
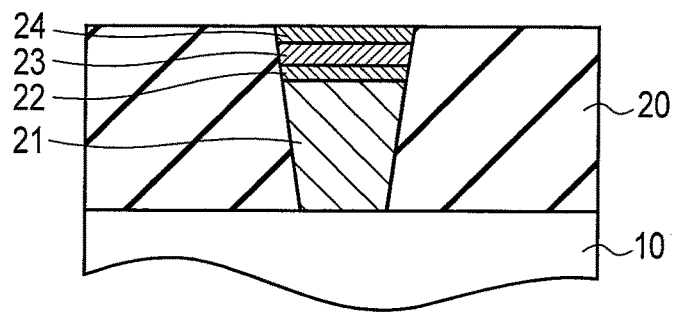
FIGS. 6A to 6C are cross-sectional views showing manufacturing steps of the memory cell module shown in FIG. 5.

First, an interlayer insulation film 20 is deposited on a Si substrate 10 in which a switching transistor is formed, and a contact hole is formed in the interlayer insulation film 20, as shown in FIG. 6A. Subsequently, the lower electrode 21 formed of β-Ta, the conductive layer 22 formed of a-CoFeB, the conductive layer 23 formed of β-Ta, and the buffer layer 24 formed of Hf are embedded in the contact hole formed in the interlayer insulation film 20.

Figure 6B:
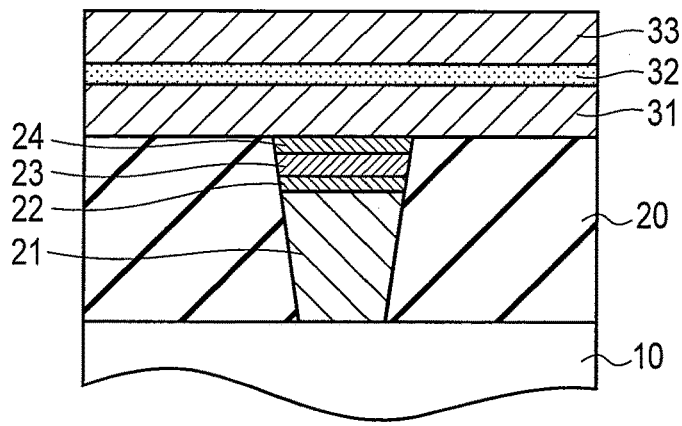

Next, the CoFeB film 31, the MgO film 32, and the CoFeB film 33 which are constituent elements of the MTJ element are formed on the buffer layer 24 and the interlayer insulation film 20 by spattering, etc., as shown in FIG. 6B.

Figure 6C:
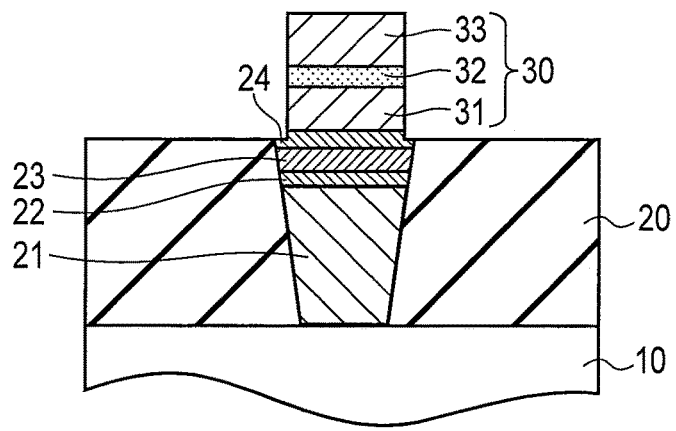

Next, the CoFeB film 31, the MgO film 32, and the CoFeB film 33 are processed in a cell pattern by the etching, as shown in FIG. 6C. At this time, the etching is stopped at the buffer layer 24. In other words, the MTJ element is etched from the CoFeB film 33 side to the buffer layer 24, by RIE, etc., using a mask (not shown). The following advantages can be obtained by thus etching.

In other words, since a total etching amount is reduced as compared with etching up to the lower electrode 21 similarly to the first embodiment, deposition of the etching product on the side wall surface of the MTJ element 30 can be suppressed. Furthermore, since the etching is stopped at not the lower electrode 21, but the buffer layer 23, the finally etched portion is Hf having a lower standard electrode potential than Ta. For this reason, the substance deposited on the side wall surface of the MTJ element 30 can be easily oxidized. Short failure on the side wall surface can be thereby suppressed.

Thus, according to the present embodiment, the conductive layers 22 and 23 and the buffer layer 24 are embedded in the contact hole together with the lower electrode 21, and the etching for formation of the MTJ element is stopped at the buffer layer 24. Therefore, the same advantage as that of the first embodiment can be obtained, and the short failure on the side wall surface of the MTJ element 30 can be thereby suppressed.

In the present embodiment, stopping the etching for formation of the MTJ element at the buffer layer 24 is significant. Accordingly, the conductive layers 22 and 23 and the buffer layer 24 do not need to be embedded in the contact hole of the interlayer insulation film 20.

The etching for formation of the MTJ element may be stopped at the buffer layer 24, in a structure in which the lower electrode 21 alone is embedded in the contact hole of the interlayer insulation film 20 and the conductive layers 22 and 23 and the buffer layer 24 are formed on the interlayer insulation film 20, similarly to the first embodiment. More specifically, the etching is first executed up to the conductive layer 22 to leave a region wider than the cell pattern and then the etching is executed up to the buffer layer 24 for formation of the cell pattern. In this case, too, deposition of the etching product on the side wall surface of the MTJ element 30 can be suppressed. Short failure on the side wall surface can be thereby suppressed.

Modified Embodiment

The inventions are not limited to each of the above-described embodiments.

The second conductive layer is inserted between the lower electrode and the first conductive layer in the above embodiments. However, if the materials of the lower electrode and the first conductive layer are different, the second conductive layer can be omitted.

The material of the lower electrode is not limited to Ta, but the lower electrode may be preferably embedded in the contact hole and have sufficient conductivity. The material of the lower electrode may be W, TiN or Cu other than Ta. Similarly, the material of the first conductive layer may be W, TiN or Cu other than Ta.

The material of the buffer layer is not limited to Hf, but any material capable of suppressing diffusion to the upper layer side of the MTJ element and having a low standard electrode potential is desirable. For example, Ta, Zn, Cr, Nb, V, Mn, Zr, Pa, Hf, Ti, Al, Be, Sc, Nd, Gd, Tb, Lu and Dy, and alloys thereof, etc. can also be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the inventions.

What is claimed is:

1. A magnetoresistive element, comprising:
   a lower electrode having crystallinity on a substrate;
   a first conductive layer including an amorphous state on the lower electrode;
   a buffer layer on the first conductive layer; and
   an MTJ element on the buffer layer.

2. The magnetoresistive element of claim 1, wherein the MTJ element is a layered structure in which a nonmagnetic layer is sandwiched between magnetic layers.

3. The magnetoresistive element of claim 1, wherein a material of the lower electrode is same as a material of the first conductive layer.

4. The magnetoresistive element of claim 1, further comprising a second conductive layer including an amorphous state, a material of the second conductive layer being different from a material of the lower electrode and the second conductive layer being inserted between the lower electrode and the first conductive layer.

5. The magnetoresistive element of claim 4, wherein the second conductive layer is a boride or a nitride of a metal.

6. The magnetoresistive element of claim 1, wherein each of the lower electrode and the first conductive layer includes at least one of Ta, W, TiN and Cu.

7. The magnetoresistive element of claim 1, wherein the buffer layer includes at least one of Hf, Ta, Zn, Cr, Nb, V, Mn, Zr, Pa, Hf, Ti, Al, Be, Sc, Nd, Gd, Tb, Lu and Dy.

8. The magnetoresistive element of claim 1, further comprising an interlayer insulation film on the substrate, wherein the lower electrode, the first conductive layer and the buffer layer are in a contact hole in the interlayer insulation film.

9. A nonvolatile semiconductor memory, comprising:
a transistor provided on a surface portion of a semiconductor substrate;
an interlayer insulation film on the semiconductor substrate, the interlayer insulation film comprising a contact hole connected to one of a source and a drain of the transistor;
a lower electrode having crystallinity, in the contact hole of the interlayer insulation film, the lower electrode being connected to one of the source and the drain of the transistor;
a first conductive layer including an amorphous state on the lower electrode;
a buffer layer on the first conductive layer; and
an MTJ element on the buffer layer.

10. The memory of claim 9, wherein a material of the lower electrode is same as a material of the first conductive layer.

11. The memory of claim 9, further comprising a second conductive layer including an amorphous state, a material of the second conductive layer being different from the material of the lower electrode and the second conductive layer being inserted between the lower electrode and the first conductive layer.

12. The memory of claim 11, wherein the second conductive layer is a boride or a nitride of a metal.

13. The memory of claim 9, wherein each of the lower electrode and the first conductive layer includes at least one of Ta, W, TiN and Cu.

14. The memory of claim 9, wherein the buffer layer includes at least one of Hf, Ta, Zn, Cr, Nb, V, Mn, Zr, Pa, Hf, Ti, Al, Be, Sc, Nd, Gd, Tb, Lu and Dy.

15. The memory of claim 9, wherein the first conductive layer and the buffer layer are in the contact hole.

16. The magnetoresistive element of claim 1, wherein the buffer layer has crystallinity.

17. The magnetoresistive element of claim 9, wherein the buffer layer has crystallinity.

* * * * *